(12) United States Patent
Ray

(10) Patent No.: US 7,741,882 B1
(45) Date of Patent: Jun. 22, 2010

(54) CURRENT-LIMITED OUTPUT BUFFER

(75) Inventor: Abhijit Ray, Sunnyvale, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 12/173,405

(22) Filed: Jul. 15, 2008

(51) Int. Cl.
*H03K 3/00* (2006.01)
(52) U.S. Cl. .......................... 327/108; 327/112; 326/83
(58) Field of Classification Search ................ 327/108, 327/112; 326/82, 83
See application file for complete search history.

(56) References Cited

U.S. PATENT DOCUMENTS

| | | | | |
|---|---|---|---|---|
| 5,900,752 | A | * | 5/1999 | Mar ........................... 327/143 |
| 6,459,325 | B1 | * | 10/2002 | Hall et al. ................... 327/391 |
| 6,759,880 | B2 | | 7/2004 | Koch et al. .................. 327/112 |
| 7,400,170 | B2 | * | 7/2008 | Bitting ........................ 326/82 |
| 2008/0308816 | A1 | | 12/2008 | Miller et al. .................. 257/76 |

* cited by examiner

*Primary Examiner*—Kenneth B. Wells
(74) *Attorney, Agent, or Firm*—Baker Botts, L.L.P.

(57) ABSTRACT

An output buffer circuit includes a first output transistor having a source terminal connected to a voltage supply and a drain terminal connected to an output node. The first output transistor is capable of coupling the output node to the voltage supply when the input signal is at a high voltage in the input voltage range. The circuit also includes a second output transistor having a drain terminal connected to the output node and a source terminal connected to ground. The second output transistor is capable of coupling the output node to ground when the input signal is at a low voltage in the input voltage range. The circuit further includes a current-limiting circuit coupled to a gate terminal of the first output transistor and capable of limiting a current flowing through the gate terminal when the first output transistor is turned on. The output node outputs an output signal in an output voltage range, wherein a high voltage of the output voltage range exceeds the high voltage of the input voltage range.

21 Claims, 4 Drawing Sheets

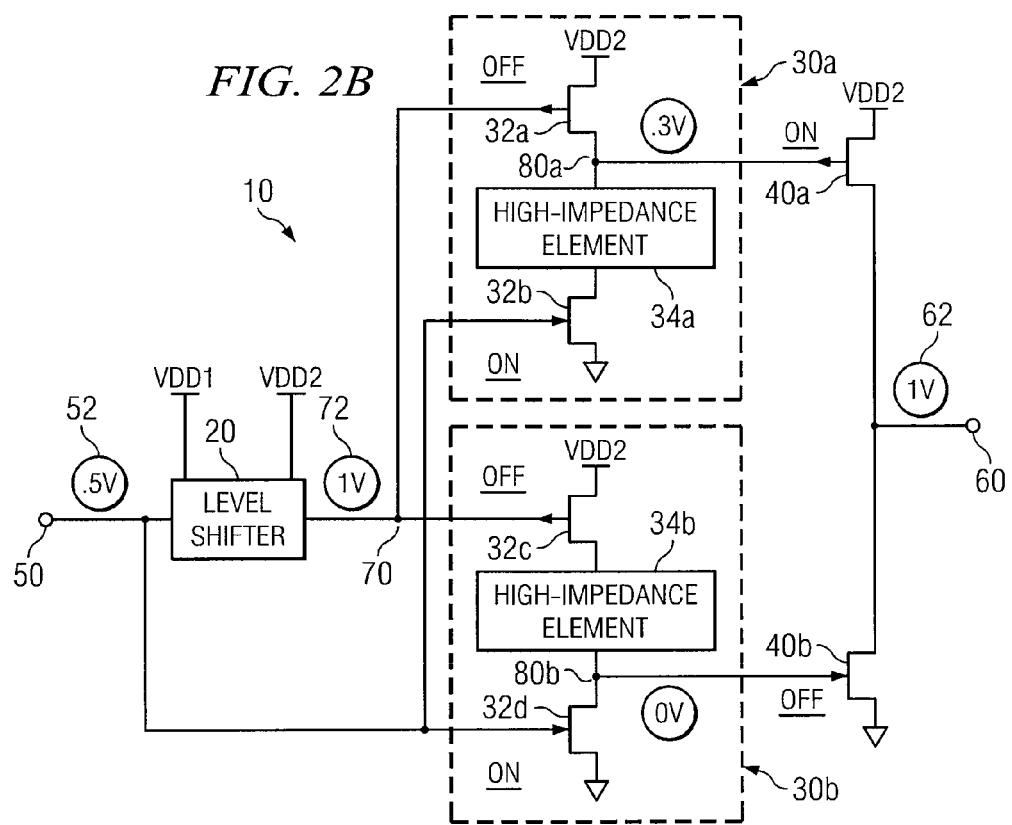
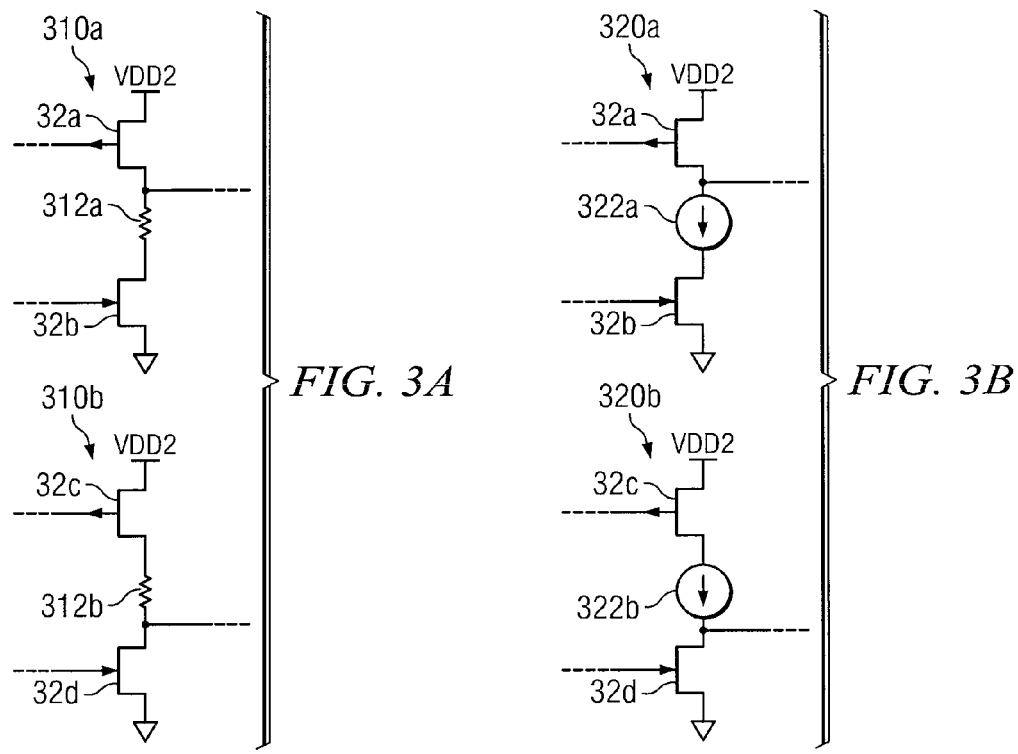

US 7,741,882 B1

CURRENT-LIMITED OUTPUT BUFFER

TECHNICAL FIELD OF THE INVENTION

This invention relates, in general, to digital logic circuits and, more particularly, to an improved output buffer circuit.

BACKGROUND OF THE INVENTION

As a result of the rapid technological growth of the past several decades, transistors and other semiconductor devices have become a fundamental building block for a wide range of electronic components. Metal-oxide silicon field-effect transistors (MOSFETs) have been the primary choice for transistors in many applications including general-use microprocessors, digital signal processors, application specific integrated circuits (ASICs) and various other forms of electronic devices. With the demand for electronic devices that are increasingly smaller and faster, the inclusion of the metal oxide layer from which MOSFETs derive their name creates significant limitations to further improvements in the size and operating speed of such devices. The use of alternative semiconductor devices, such as junction field-effect transistors (JFETs), may create other problems, however, especially if these semiconductor devices must ultimately interface with MOSFET components.

SUMMARY OF THE INVENTION

In accordance with the present invention, the disadvantages and problems associated with output buffers have been substantially reduced or eliminated. In particular, an output buffer system is provided with increased speed and/or reduced size.

In accordance with one embodiment of the present invention, an output buffer circuit includes an input node, a first output junction field-effect transistor (JFET), a second output JFET, a current-limiting circuit, and an output node. The input node receives an input signal associated with an input voltage range. The first output junction JFET has a source terminal connected to a voltage supply and a drain terminal connected to an output node. This voltage supply provides a voltage that exceeds the high voltage in the input voltage range. The second output JFET has a drain terminal connected to the output node and a source terminal connected to ground. The first output JFET is capable, when the input signal is at the high voltage in the input voltage range, of coupling the output node to the voltage supply, and the second output JFET is capable, when the input signal is at the low voltage in the input voltage range, of coupling the output node to ground. Additionally, in this embodiment, the current-limiting circuit is coupled to a gate terminal of the first output JFET and is capable of limiting a current flowing through the gate terminal when the first output JFET is turned on. The output node outputs an output signal associated with an output voltage range. A high voltage of the output voltage range is substantially equal to the voltage provided by the voltage supply.

In accordance with another embodiment of the present invention, a method for generating an output signal includes detecting a voltage level of an input signal associated with an input voltage range. The method further includes turning on a first output transistor in response to detecting that the input signal is at a high voltage of the input voltage range and, while the first output transistor is turned on, limiting the current flowing through the gate terminal of the first output transistor. The first output transistor couples an output node to a voltage supply when turned on. Additionally, the voltage supply provides a voltage level greater than the high voltage of the input voltage range.

The method also includes turning on a second output transistor in response to detecting that the input signal is at a low voltage of the input voltage range. The second output transistor couples the output node to ground when turned on. Additionally, the method includes outputting an output signal at the output node. The output signal has a voltage within a second voltage range, and a high voltage of the output voltage range exceeds the high voltage of the input voltage range.

Technical advantages of certain embodiments of the present invention include an output buffer circuit with improved operating speed. Moreover, particular embodiments may provide smaller output buffer circuits or output buffer circuits capable of operating with reduced power requirements. Other technical advantages of the present invention will be readily apparent to one skilled in the art from the following figures, descriptions, and claims. Additionally, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which:

FIGS. 2A and 2B illustrate example operation of the output buffer circuit shown in FIG. 1;

FIGS. 3A-3C illustrate various embodiments of a high-impedance element that may be included in particular embodiments of the output buffer circuit of FIG. 1.

DETAILED DESCRIPTION OF THE INVENTION

Figure 1:
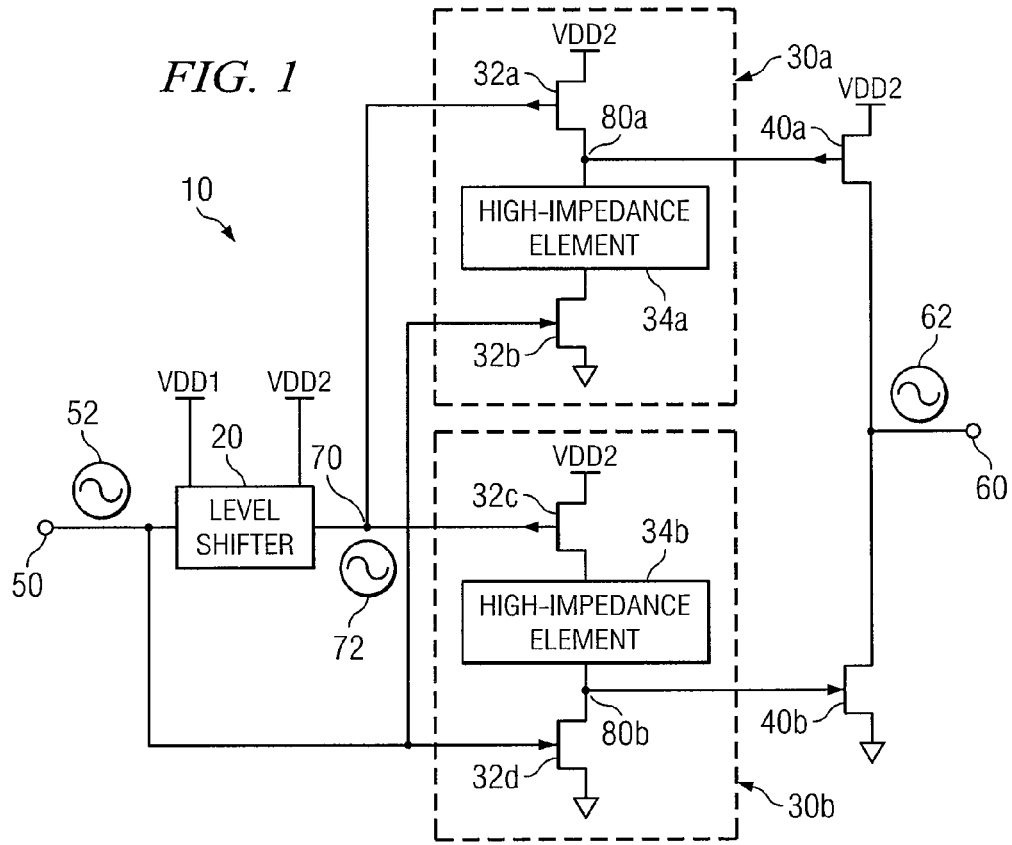
FIG. 1 illustrates an output buffer circuit according to a particular embodiment of the present invention.

FIG. 1 illustrates a particular embodiment of an output buffer circuit 10 capable of receiving an input signal 52 within a first range and outputting an output signal 62 within a second range that differs from the first range. As shown in FIG. 1, the illustrated embodiment of output buffer circuit 10 includes a level shifter 20, current-limiting circuits 30a and 30b, output transistor 40a, and an output transistor 40b. In the illustrated embodiment, output transistor 40a and output transistor 40b pull output node 60 between a high voltage and a low voltage, respectively, within the second voltage range based on the voltage level of input signal 52. By limiting the current flowing through a gate terminal of output transistor 40a, current limiting circuit 30a facilitates the use of higher gate-source voltage differentials without damaging the components of output buffer circuit 10. The use of higher gate-source voltage differentials may, in turn, increase the speed in which circuit buffer circuit 10 can transition output signal 62.

Level shifter 20 represents any appropriate component, element, and/or combination of components or elements suitable to receive an input signal 52 having a voltage within a first voltage range (referred to here as the "input voltage range") and generate a shifted signal 72 at shift node 70 that has a voltage that is within a second voltage range (referred to here as the "shifted voltage range") and corresponds to the voltage of input signal 52. For example, in the illustrated embodiment, level shifter 20 couples to a first supply voltage having a voltage of $V_{DD1}$ and a second supply voltage having a voltage of $V_{DD2}$. Furthermore, in the illustrated embodiment, level shifter 20 receives an input signal 52 having a low voltage level of 0 V and a high voltage level of $V_{DD1}$ (e.g., 0.5 V). In the illustrated embodiment, level shifter 20 then generates shifted signal 72 having a voltage between $V_{DD1}$ and $V_{DD2}$ (e.g., 1 V). Although, in the illustrated embodiment, the input voltage range covers a voltage differential equal in magnitude to the differential covered by the shifted range (e.g., 0.5 V), in alternative embodiments, level shifter 20 may generate shifted signals 72 spanning any appropriately-sized shifted voltage range depending on the configuration and contents of output buffer circuit 10.

Current-limiting circuit 30a biases output transistor 40a to selectively turn output transistor 40a on and limits the current flowing through the gate terminal of output transistor 40a when output transistor 40a is turned on. Similarly, current-limiting circuit 30b biases output transistor 40b to selectively turn output transistor 40b on and limits the current flowing through the gate terminal of output transistor 40b when output transistor 40b is turned on. Depending on the polarity of output transistor 40a and output transistor 40b, current-limiting circuits 30a and 30b may limit the current flowing into or the current flowing out of the relevant output transistor. For example, in the illustrated embodiment, output transistor 40a represents a p-type JFET while output transistor 40b represents an n-type JFET. Consequently, in the illustrated embodiment, current-limiting circuit 30a limits the current flowing out of the gate terminal of the p-type JFET, while current-limiting circuit 30b limits the current flowing into the gate terminal of the n-type JFET.

Figure 3C:
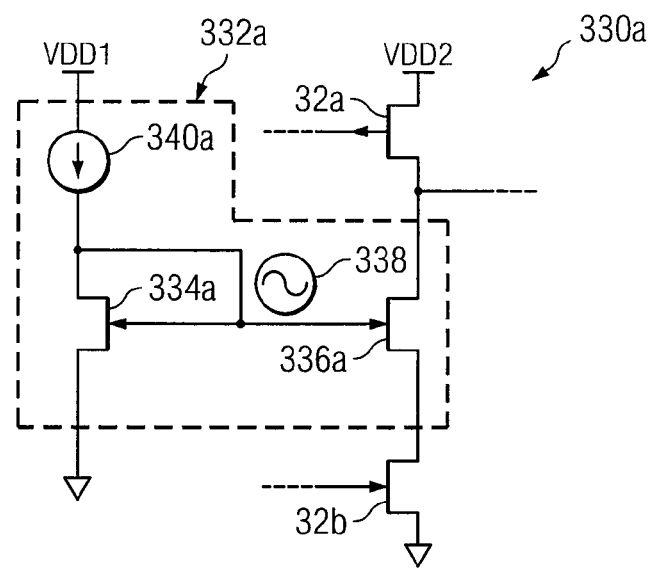
Figure 3C:
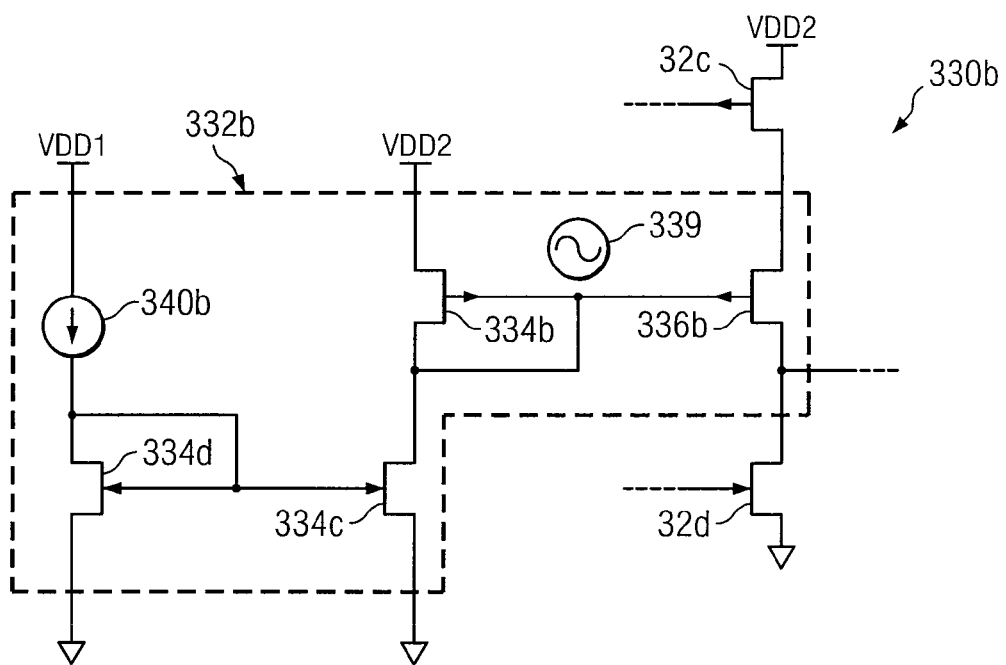

Furthermore, current-limiting circuits 30a and 30b may include any appropriate combination of components suitable to provide the described functionality. For example, in the illustrated embodiment, current-limiting circuit 30a includes limiting transistors 32a and 32b and a high-impedance element 34a, while current-limiting circuit 30b includes limiting transistors 32c and 32d and a high-impedance element 34b. Current-limiting transistors 32a-32d may represent any suitable type of transistors. Moreover, high-impedance elements 34a and 34b may represent any appropriate component or collection of components suitable to provide a high-impedance path between its relevant terminals. FIGS. 3A-3C and the corresponding text describe various different examples of high-impedance elements 34a and 34b that may be used in certain embodiments of output buffer circuit 10.

Although the embodiment of output buffer circuit 10 shown in FIG. 1 includes two current-limiting circuits 30a and 30b, alternative embodiments may include only a single current-limiting circuit 30 coupled to the gate terminal of output transistor 40a or 40b. For example, in particular embodiments, output buffer circuit 10 may only include current-limiting circuit 30a coupled to the gate terminal of output transistor 40a. The current-limiting circuit 30b shown in FIG. 1 may be replaced by an inverter that receives input signal 52 and outputs an inverted version of input signal 52 to output transistor 40b.

Output transistor 40a and output transistor 40b generate output signal 62 by selectively coupling an output node 60 to a second supply voltage (shown in FIG. 1 as "$V_{DD2}$") or to ground, respectively. As a result, output signal 62 has a voltage within a third range (referred to here as the "output voltage range"). In particular embodiments, this output voltage range may span a range defined by the low voltage of the input voltage range and the high voltage of the shifted voltage range. For example, in the illustrated embodiment, the output voltage range spans the range from 0 V to 1 V.

Output transistor 40a and output transistor 40b may represent any form of transistors appropriate to provide the described functionality. Additionally, output transistor 40a has a first polarity while output transistor 40b has a second polarity. For example, in the illustrated embodiment, output transistor 40a is a p-type transistor, while output transistor 40b is an n-type transistor. As one specific example, in particular embodiments, output transistor 40a and output transistor 40b may represent junction field-effect transistors (JFETs). Additionally, in particular embodiments, these JFETs may operate as enhancement-mode devices, with the n-type devices conducting current between their drain and source terminals when the voltage differential applied between their gate and source terminals is positive. Moreover, in particular embodiments, these JFETs may turn on at relatively low voltages allowing for low power requirements for output buffer circuit 10 and/or a larger circuit that output buffer circuit 10 is a part of. For example, in particular embodiments, output transistor 40a and output transistor 40b represent JFETs that turn on when a voltage (referred to herein as the "operating voltage") of 0.5 V is applied (with the appropriate polarity) across the gate terminal and the source terminal of the JFET.

In operation, output buffer circuit 10 receives input signal 52 at an input node 50. Input node 50 may represent the input to an integrated circuit, a particular stage of a circuit, or any other collection of components. As noted above, input signal 52 has a voltage that is within an input voltage range associated with output buffer circuit 10. Both current-limiting circuits 30a and 30b and level shifter 20 couple to input node 50 and receive input signal 52.

In particular, limiting transistors 32b of current-limiting circuit 30a and limiting transistor 32d of current-limiting circuit 30b receive input signal 52 at their gate terminals. Input signal 52 sets the gate-to-source voltage differential for limiting transistors 32b and 32d, and limiting transistors 32b and 32d turn on based on the voltage of input signal 52.

Meanwhile, level shifter 20 also receives input signal 52 as an input. Based on the received input signal 52, level shifter 20 outputs shifted signal 72 having a voltage within a shifted voltage range that differs from the input voltage range. For example, in the illustrated embodiment, level shifter 20 generates a shifted signal 72 within a shifted voltage range from 0.5 V to 1 V based on an input signal 52 within an input voltage range of 0V to 0.5V. Current-limiting circuits 30a and 30b couple to level shifter 20 and receive shifted signal 72.

In particular, limiting transistor 32a of current-limiting circuit 30a and limiting transistor 32c of current-limiting circuit 30b, respectively, receive shifted signal 72 at their gate terminals. Shifted signal 72 sets the gate-to-source voltage differential for limiting transistors 32a and 32c, and limiting transistors 32a and 32c turn on based on the voltage of shifted signal 72.

As a result of the operation of limiting transistors 32a-32d, current-limiting circuits 30a and 30b generate voltages at control nodes 80a and 80b. The voltages of control nodes 80a and 80b control the operation of output transistors 40a and 40b. More specifically, the voltages of control nodes 80a and 80b determine the gate-to-source voltage differential of output transistors 40a and 40b, respectively. Based on these gate-to-source voltage differentials, output transistors 40a and 40b selectively turn on and turn off.

Figure 2A:
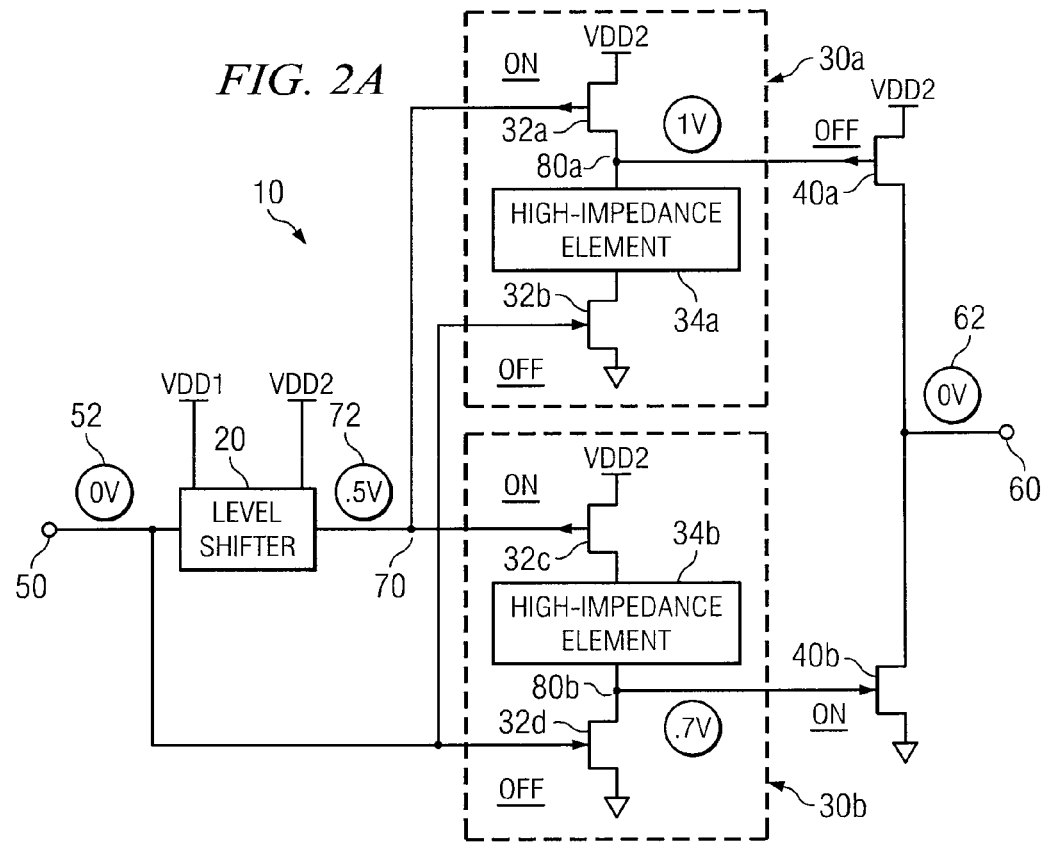

Thus, as illustrated further by the examples of FIGS. 2A and 2B, when input signal 52 is at the high voltage within the input voltage range, current-limiting circuit 30a sets control node 80a to a voltage that turns on output transistor 40a and current-limiting circuit 30b sets control node 80b to a voltage that turns off output transistor 40b. As a result, output transistor 40a pulls output node 60 to $V_{DD}$. By contrast, when input signal 52 is at the low voltage within the input voltage range, current-limiting circuit 30a sets control node 80a to a voltage that turns off output transistor 40a and current-limiting circuit 30b sets control node 80b to a voltage that turns on output transistor 40b. As a result, output transistor 40b pulls output node 60 to ground. Consequently, output signal 62 is set to the high voltage level within the output voltage range when the received input signal 52 is set to the high voltage level within the input voltage range and is set to the low voltage level within the output voltage range when the received input signal 52 is set to the low voltage level within the input voltage range.

Additionally, by using a $V_{DD}$ higher than the high voltage in the input voltage range, output buffer circuit 10 may turn output transistors 40 on with source-gate voltage differentials greater than the operating voltage for output transistors 40. This may, in turn, reduce the resistance of output transistors 40 when output transistors 40 are turned on and increase the current flowing between drain and source terminals of output transistors 40. As a result, in particular embodiments, output buffer circuit 10 may charge or discharge a capacitive load more quickly than if output transistors 40 were operated at their operating voltages.

If the gate-source voltage differentials applied to output transistors 40 are raised too high, however, the gate-source voltage differential may exceed the cut-in voltage of the pn-junction formed between the gate and source terminals or between the source and gate terminals (depending on the polarity of the device) of the relevant output transistor 40. The relevant pn-junction will, as a result, become forward-biased. A forward-biased gate junction may allow a substantial amount of current to flow between the gate and the source in one direction or the other, potentially damaging the relevant output transistor and/or other components of output buffer circuit 10. Limiting the current flowing between the gate and source prevents excessive forward-biased junction current.

Thus, to prevent problems of excessive current flow during forward-biasing, particular embodiments of current-limiting circuits 30a and 30b include high-impedance elements 34 that limit the current flowing through the gate terminals of output transistors 40a or 40b. For example, in the illustrated embodiment, high-impedance element 34a limits the current flowing out of the gate terminal of output transistor 40a, and high-impedance element 34b limits the current flowing in to the gate terminal of output transistor 40b. As a result, output buffer circuit 10 may, in particular embodiments, be able to operate safely with the gate-source pn-junctions of either output transistor forward-biased.

Consequently, in particular embodiments, current limiting circuits 30 allow output transistors 40 to be safely turned on with a gate to source voltage at the cut-in voltage of their gate/source p-n junctions, which may be higher than the nominal operating voltage of the enhancement JFETs used in certain embodiments of output buffer circuit 10. In particular embodiments, output circuit buffer 10 may additionally or alternatively be able to meet desired timing requirements using smaller transistors, thereby reducing the size of output buffer circuit 10. Thus, particular embodiments of output buffer circuit 10 may provide multiple operational benefits. Specific embodiments, however, may provide all, some, or none of these benefits.

FIGS. 2A and 2B illustrate examples of the operation of particular embodiments of output buffer circuit 10. In particular, FIG. 2A illustrates the operation of the various components of output buffer circuit 10 when input signal 52 is at the low voltage within the input voltage range (e.g., 0V in the illustrated example). By contrast, FIG. 2B illustrates the operation of the various components when input signal 52 is at the high voltage within the input voltage range (e.g., 0.5 V in the illustrated example).

As shown in FIG. 2A, when output buffer circuit 10 receives a low input signal 52, input signal 52 turns off transistor 32b of current-limiting circuit 30a and transistor 32d of current-limiting circuit 30b. Consequently, neither control node 80a nor control node 80b is connected to ground. Additionally, as a result of the low-voltage input signal 52, level shifter 20 outputs a shifted signal 72 with a voltage equal to the low voltage in the shifted voltage range (e.g., 0.5 V in the illustrated example). This low-voltage shifted signal 72 turns on transistor 32a of current-limiting circuit 30a and transistor 32c of current-limiting circuit 30b. As a result, control node 80a is coupled directly to $V_{DD2}$. Additionally, because control node 80a is also coupled to the gate terminal of output transistor 40a, the gate-source voltage differential for output transistor 40a will be zero and output transistor 40a will be turned off as a result.

Meanwhile, because transistor 32c is turned on, control node 80b is connected to $V_{DD2}$ through high-impedance element 34b, resulting in control node 80b having a positive voltage somewhere below $V_{DD2}$. More specifically, because $V_{DD2}$ is greater than the cut-in voltage of the pn-junction of output transistor 40b, that pn-junction will become forward biased and control node 80b will stabilize at the cut-in voltage of the pn-junction (e.g., 0.7 V in the illustrated embodiment). With control node 80b stabilized at this cut-in voltage, the gate-source voltage differential for output transistor 40b will be greater than the threshold voltage, and output transistor 40b will be turned on. Furthermore, while output transistor 40b is turned on, output node 60 will discharge.

Because the gate-source pn-junction is forward-biased, however, current can flow between the gate terminal of output transistor 40b through the source terminal to ground. Nonetheless, high-impedance element 34b of current-limiting circuit 30b prevents the current flowing from gate to source from exceeding a predetermined safe level. As a result, current-limiting circuit 30b allows output transistor 40b to operate safely with the gate-source pn-junction forward biased. In addition, because the gate-source voltage differential is greater than the normal operating voltage of output transistor 40b, output transistor 40b may discharge output node 60 more quickly than if the gate-source voltage differential were limited by the operating voltage ($V_{DD1}$) of the JFETs that may be used in particular embodiments of output buffer circuit 10.

Similarly, as shown in FIG. 2B, when output buffer circuit 10 receives a high input signal 52 at input node 50, level shifter 20 outputs a shifted signal 72 with a voltage equal to the high voltage in the shifted voltage range (e.g., 1 V in the illustrated example). This high-voltage shifted signal 72 turns off transistor 32a of current-limiting circuit 30a and transistor 32c of current-limiting circuit 30b, because the source-gate voltage differential for both these transistors is 0 V. As a result, neither control node 80a nor control node 80b is coupled directly to $V_{DD}$.

Additionally, the high-voltage input signal 52 creates a positive gate-source voltage differential (here 0.5 V) that equals the operating voltage of transistor 32d. As a result, input signal 52 turns on transistor 32d and control node 80b is consequently coupled directly to ground. Because control node 80b is grounded, output transistor 40b is turned off.

Meanwhile, the high-voltage input signal 52 also turns on transistor 32b, and control node 80a is consequently coupled to ground through high impedance element 34a, resulting in control node 80a having a relatively small positive voltage. This creates a source-gate voltage differential that is equal to the cut-in voltage of the source-gate pn junction. As a result, that pn-junction will become forward biased and control node 80a will stabilize with a source-gate voltage differential that is equal to the cut-in voltage of the pn-junction. For example, in the illustrated example, the source-gate voltage differential will stabilize at 0.7V resulting in a voltage level of 0.3V for control node 80a. With control node 80a stabilized so that the source-drain voltage differential is equal to the relevant cut-in voltage, the source-drain voltage differential will be greater than the operating voltage of output transistor 40a, and output transistor 40a will be turned on. Furthermore, while output transistor 40a is turned on, output node 60 will charge, increasing the voltage of output signal 62.

Because the gate-source pn-junction is forward biased, however, current can flow from $V_{DD2}$ to the source terminal of output transistor 40a and through the gate terminal of output transistor 40a. Nonetheless, high-impedance element 34a of current-limiting circuit 30a prevents the current flowing from source to gate from exceeding a predetermined safe level. As a result, current-limiting circuit 30a allows output transistor 40a to operate safely with the source-gate pn-junction forward biased. In addition, because the source-gate voltage differential is greater than the normal operating voltage (in this case $V_{DD1}$) for output transistor 40a, output transistor 40a may charge output node 60 more quickly than if the source-gate voltage differential were limited by the operating voltage of output transistor 40a or 40b. Thus, overall, by exceeding the cut-in voltages of the pn-junctions in output transistors 40a and/or 40b, output buffer circuit 10 can charge and discharge output node 60 more quickly.

FIGS. 3A-3C illustrate various embodiments of a high-impedance element 34 that may be included in particular embodiments of output buffer circuit 10. As noted above, high impedance elements 34 of FIG. 1 may represent any appropriate component or collection of components suitable to limit the flow of current through such high-impedance elements 34. Thus, FIGS. 3A-3C illustrate various specific high-impedance elements that may be used in particular embodiments of output buffer circuit 10.

FIG. 3A illustrates particular embodiments of current-limiting circuits 30 (shown as current-limiting circuits 310a and 310b) in which high-impedance elements are represented by resistors 312. The resistance of resistors 312 can be chosen based on current limitations for output transistors 40, timing requirements for output buffer circuit 10, and/or any other appropriate design considerations.

FIG. 3B illustrates particular embodiments of current-limiting circuits 30 (shown as current-limiting circuits 320a and 320b) in which high-impedance elements are represented by constant current sources 322. Like the resistance of resistors 312, the current output by constant current sources 322 may be chosen based on current limitations for output transistors 40, timing requirements for output buffer circuit 10, and/or any other appropriate design considerations.

FIG. 3C illustrates particular embodiments of current-limiting circuits 30 (shown as current-limiting circuits 330a and 330b) in which the high-impedance elements each represent a portion of a current mirror circuit 332 that includes a biasing transistor 334 and a mirror transistor 336. As shown in FIG. 3C, mirror transistor 336a of current mirror circuit 332a couples to a biasing transistor 334a that receives current at its drain from a constant current source 340a. Biasing transistor 334a provides an n-bias signal 338. N-bias signal 338 sets the maximum current that can flow from the drain terminal to the source terminal of mirror transistor 336a and, thus, the maximum current that can flow out of the gate terminal of output transistor 40a.

Similarly, mirror transistor 336b of current mirror circuit 332b couples to a biasing transistor 334b. The drain terminal of biasing transistor 334b couples to the drain terminal of a biasing transistor 334c. The gate terminal of biasing transistor 334c is coupled to the gate terminal of another biasing transistor 334d. Biasing transistor 334d receives current at its drain from a constant current source 340b. Biasing transistor 334b provides a p-bias signal 339, which sets the maximum current that can flow from the source terminal to the drain terminal of mirror transistor 336b and, thus, the maximum current that can flow into the gate terminal of output transistor 40b.

Current mirror circuits 332a and 332b may be designed so that the current flowing through mirror transistors 336a and 336b is set to an appropriate level based on current limitations for output transistors 40, timing requirements for output buffer circuit 10, and/or any other appropriate design considerations.

Figure 4:
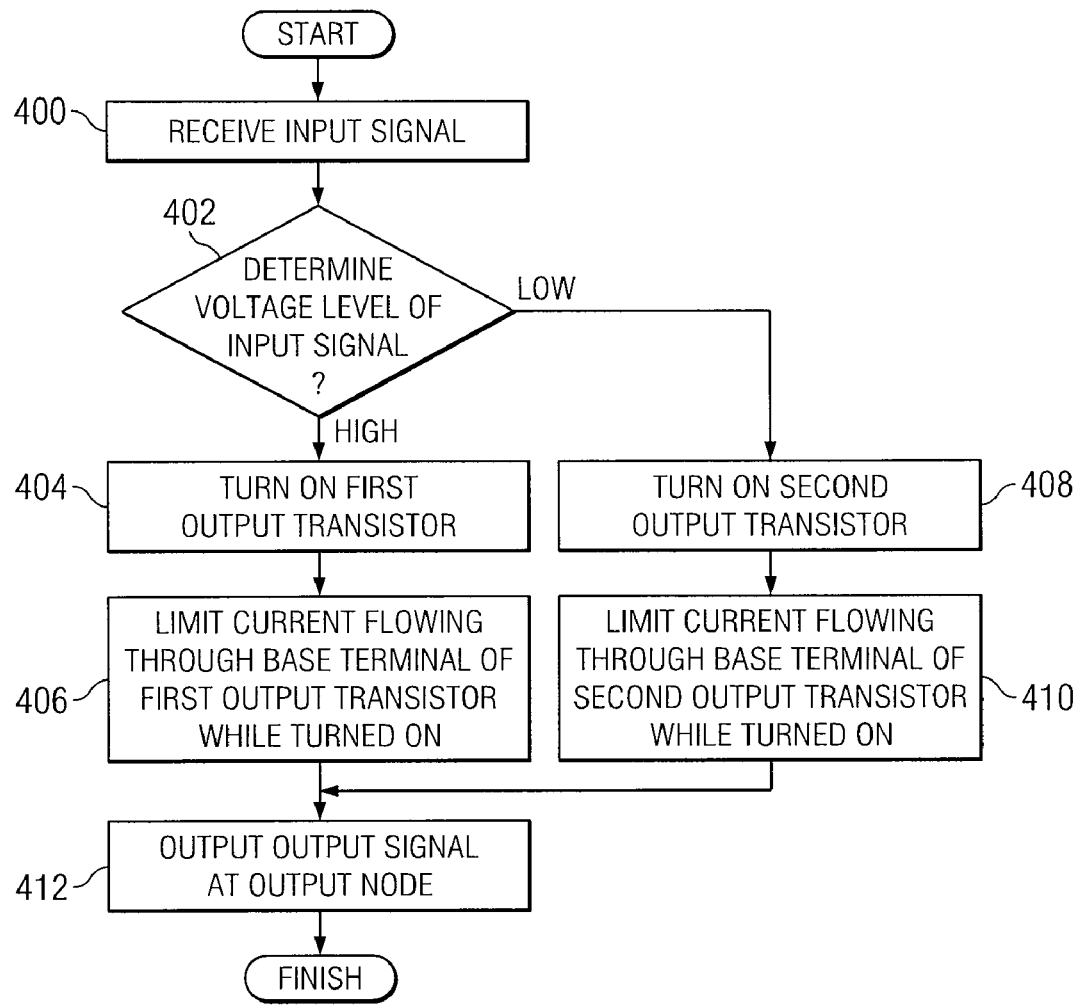
FIG. 4 is a flow chart illustrating example operation of an output buffer circuit according to particular embodiments of the present invention.

FIG. 4 is a flowchart illustrating an example operation of a particular embodiment of output buffer circuit 10 according to a particular embodiment. The steps illustrated in FIG. 4 may be combined, modified, or deleted where appropriate. Additional steps may also be added to the example operation. Furthermore, the described steps may be performed in any suitable order.

Operation of output buffer circuit 10 in the described example begins with output buffer circuit 10 receiving input signal 52 at step 400. As noted above, input signal 52 has a voltage within an input voltage range. For example, in particular embodiments, input signal 52 has a voltage within the range of 0V to 0.5 V.

At step 402, output buffer circuit 10 detects a voltage level of input signal 52. In particular embodiments, output buffer circuit 10 may detect the voltage level by selectively turning one or more output transistors 40 on based on the voltage of input signal 52. For example, if input signal 52 is at the high voltage of the input voltage range, output buffer circuit 10 turns on a first output transistor 40a at step 404. This first output transistor 40a couples an output node 60 of output buffer circuit 10 to a voltage supply when turned on. In particular embodiments, this voltage supply provides a voltage level greater than the high voltage of the input voltage range. Additionally, as shown at step 406, output buffer circuit 10 limits the current flowing through the gate terminal of first output transistor 40a while first output transistor 40a is turned on.

If, instead, input signal 52 is at the low voltage of the input voltage range, output buffer circuit 10 turns on a second output transistor 40b at step 408. This second output transistor 40b couples output node 62 to ground when turned on. In particular embodiments, output buffer circuit 10 turns on second output transistor 40b by setting a voltage differential between a gate terminal and a source terminal of second output transistor 40b to greater than an operating voltage for second output transistor 40b. Additionally, as shown at step 410, output buffer circuit 10 limits the current flowing through the gate terminal of the second output transistor while second output transistor 40b is turned on.

Output buffer circuit 10 outputs output signal 60 at output node 62 at step 412. Output signal 60 has a voltage within an output voltage range. In particular embodiments, the output voltage range is greater than the input voltage range. Operation of output buffer circuit 10 may then end as shown in FIG. 4.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. An output buffer circuit, comprising:
   an input node operable to receive an input signal associated with an input voltage range;
   a first output transistor of a first conductivity type having a source terminal connected to a voltage supply and a drain terminal connected to an output node, wherein the first output transistor is operable, when the input signal is at a high voltage in the input voltage range, to couple the output node to the voltage supply and wherein the voltage supply provides a voltage that exceeds the high voltage in the input voltage range;
   a second output transistor of a second conductivity type having a drain terminal connected to the output node and a source terminal connected to ground, wherein the second output transistor is operable, when the input signal is at a low voltage in the input voltage range, to couple the output node to ground;
   a current-limiting circuit coupled to a gate terminal of the first output transistor and operable to limit a current flowing through the gate terminal when the first output transistor is turned on, wherein the current-limiting circuit comprises:
   a first transistor having a source terminal connected to the supply voltage and a drain terminal connected to a first terminal of a high-impedance element;
   a second transistor having a drain terminal connected to a second terminal of the high-impedance element and a source terminal connected to ground; and
   the high-impedance element, which comprises at least a portion of a current mirror; and
   the output node operable to output an output signal associated with an output voltage range, wherein a high voltage of the output voltage range is substantially equal to the voltage provided by the voltage supply.

2. The output buffer circuit of claim 1, wherein at least one of the first output transistor and the second output transistor comprises a junction field effect transistor (JFET).

3. The output buffer circuit of claim 1, wherein the voltage supply creates a voltage differential between a source terminal and a gate terminal of the first output transistor that is greater than a cut-in voltage for a pn-junction formed between the source terminal and the gate terminal when the first output transistor is turned on.

4. The output buffer circuit of claim 1, further comprising:
   a second current-limiting circuit coupled to a gate terminal of the second output transistor and operable to limit a current flowing through the gate terminal of the second output transistor when the second output transistor is turned on.

5. The output buffer circuit of claim 4, wherein the second current-limiting circuit comprises:
   a first transistor having a source terminal connected to the supply voltage and a drain terminal connected to a first terminal of a high-impedance element;
   a second transistor having a drain terminal connected to a second terminal of the high-impedance element and a source terminal connected to ground; and
   the high-impedance element.

6. The output buffer circuit of claim 1, further comprising a level shifter operable to:
   receive the input signal; and
   output a shifted signal associated with a shifted voltage range, wherein a high voltage of the shifted voltage range exceeds a high voltage of the input voltage range; and wherein the current-limiting circuit is operable to limit the current flowing through the gate terminal by limiting the current flowing through the gate terminal when the shifted signal is at the high voltage of the shifted voltage range.

7. The output buffer circuit of claim 1, wherein the first output transistor comprises a p-type transistor and the second output transistor comprises an n-type transistor, and wherein the current-limiting circuit is operable, when the shifted signal is activated, to limit a current flowing out of the gate terminal of the first output transistor.

8. The output buffer circuit of claim 1, wherein the first output transistor and the second output transistor operate as enhancement-mode devices.

9. The output buffer circuit of claim 7, wherein the first output transistor and the second output transistor are each operable to turn-on when a voltage differential of 0.5 volts is applied between the gate terminal and the source terminal of the respective output transistor.

10. The output buffer circuit of claim 1, wherein the input voltage range comprises voltages between 0 volt and 0.5 volts and the output voltage range comprises voltages between 0 volts and 1 volt.

11. A method for generating an output signal, comprising:
    detecting a voltage level of an input signal associated with an input voltage range;
    in response to detecting that the input signal is at a high voltage of the input voltage range:
       turning on a first output transistor, wherein the first output transistor couples an output node to a voltage supply when turned on and wherein the voltage supply provides a voltage level greater than the high voltage of the input voltage range; and
       while the first output transistor is turned on, limiting the current flowing through the gate terminal of the first output transistor;
       wherein limiting the current flowing through the gate terminal of the first output transistor comprises coupling a limiting transistor to the gate terminal, wherein the limiting transistor comprises a portion of a current mirror;
    in response to detecting that the input signal is at a low voltage of the input voltage range, turning on a second output transistor, wherein the second output transistor couples the output node to ground when turned on; and
    outputting an output signal at the output node, wherein the output signal has a voltage within a second voltage range, and wherein a high voltage of the output voltage range exceeds the high voltage of the input voltage range.

12. The method of claim 11, wherein at least one of the first output transistor and the second output transistor comprises a junction field effect transistor (JFET).

13. The method of claim 11, wherein turning on the first output transistor comprises setting a voltage differential between a gate terminal and the source terminal of the first output transistor to greater than a cut-in voltage for a pn-junction formed between the gate terminal and the source terminal of the first output transistor.

14. The method of claim 11, wherein turning on the second output transistor comprises:
   turning on the second output transistor; and
   while the second output transistor is turned on, limiting the current flowing through the gate terminal of the second output transistor.

15. The method of claim 14, wherein turning on the second output transistor comprises setting a voltage differential between a gate terminal and the source terminal of the second output transistor to greater than a cut-in voltage for a pn-junction formed between the gate terminal and the source terminal of the second output transistor.

16. The method of claim 11, wherein limiting the current flowing through the gate terminal of the first output transistor comprises coupling a constant current source to the gate terminal of the first output transistor.

17. The method of claim 11, wherein the first output transistor comprises a p-type JFET and the second output transistor comprises an n-type JFET.

18. The method of claim 11, wherein the first output transistor and the second output transistor operate as enhancement-mode devices.

19. The method of claim 11, wherein the first output transistor and the second output transistor are each operable to turn-on when a voltage differential of 0.5 volts is applied between the gate terminal and the source terminal of the respective output transistor.

20. The method of claim 11, wherein the input voltage range comprises voltages between 0 volt and 0.5 volts and the output voltage range comprises voltages between 0 volts and 1 volt.

21. An output buffer circuit, comprising:
   means for detecting a voltage level of an input signal associated with an input voltage range;
   means for turning on a first output transistor in response to detecting that the input signal is at a high voltage of the input voltage range, wherein the first output transistor couples an output node to a voltage supply when turned on and wherein the voltage supply provides a voltage level greater than the high voltage of the input voltage range;
   means for limiting the current flowing through the gate terminal of the first output transistor while the first output transistor is turned on, wherein the means for limiting the current comprises a portion of a current mirror;
   means for turning on a second output transistor in response to detecting that the input signal is at a low voltage of the input voltage range, wherein the second output transistor couples the output node to ground when turned on; and
   means for outputting an output signal at the output node, wherein the output signal has a voltage within a second voltage range, and wherein a high voltage of the output voltage range exceeds the high voltage of the input voltage range.

* * * * *